(12) United States Patent
Heim et al.

(10) Patent No.: US 6,448,838 B1
(45) Date of Patent: Sep. 10, 2002

(54) CIRCUIT AND METHOD FOR HIGH-SPEED BREAK-BEFORE-MAKE ELECTRONIC SWITCH

(75) Inventors: Barry B. Heim, Mesa; Daryl G. Roberts, Chandler, both of AZ (US)

(73) Assignee: Semiconductor Components Industries LLC, Phoenix, AZ (US)

( * ) Notice: Subject to any disclaimer, the term of this patent is extended or adjusted under 35 U.S.C. 154(b) by 0 days.

(21) Appl. No.: 09/808,829

(22) Filed: Mar. 16, 2001

(51) Int. Cl.[7] .............................................. H03K 17/00
(52) U.S. Cl. ..................... 327/365; 327/392; 327/375
(58) Field of Search .................................. 327/225, 228, 327/379, 389, 396, 392, 401, 365, 375–377; 326/115; 363/20, 95; 375/328, 351

(56) References Cited

U.S. PATENT DOCUMENTS

| | | | |
|---|---|---|---|
| 5,019,731 A | | 5/1991 | Kobayashi .................. 327/434 |
| 5,619,402 A | * | 4/1997 | Liu .............................. 363/20 |
| 5,872,477 A | | 2/1999 | Price, Jr. ..................... 327/392 |
| 5,886,949 A | * | 3/1999 | Villa et al. ................ 365/233.5 |
| 5,943,227 A | * | 8/1999 | Bryson et al. ................. 363/95 |

* cited by examiner

Primary Examiner—Tuan T. Lam
Assistant Examiner—Hiep Nguyen

(57) ABSTRACT

In a switching circuit, a first electrical element (22) is disabled before a second electrical element (30) is enabled. The switching operation is called break before make and ensures that disabling operation of a first electrical element occurs before enabling operation of a second electrical element. The assurance is in the form of a disable signal being detected from a first electrical element at an input of a first detection circuit (28). Correspondingly, the detected disable signal of the first electrical element enables operation of the second electrical element. Alternatively, a detected disable from the second electrical element at the input of the second detection circuit (20) enables operation of the first electrical element.

27 Claims, 5 Drawing Sheets

US 6,448,838 B1

CIRCUIT AND METHOD FOR HIGH-SPEED BREAK-BEFORE-MAKE ELECTRONIC SWITCH

BACKGROUND OF THE INVENTION

The present invention relates in general to electronic circuits and, more particularly, to high-speed break-before-make electronic switches.

Electronic switching circuits are used in a myriad of applications to switch analog and digital signals. The electronic switch makes and breaks continuity between electrical nodes. Many switches, commonly known as break-before-make (BBM), are designed to break the old connection before making a new connection to avoid short circuits and potential damage to connecting circuitry. For example, a BBM switch may connect either circuit A to circuit C or circuit B to circuit C. The connection between circuit A and circuit C is broken before the connection between circuit B and circuit C is made. The BBM switch avoids any transient and undesired connection between circuit A and circuit B.

In cellular phone applications, analog switches are used to switch between normal operating mode and sleep mode. In normal operating mode, a fixed frequency oscillator operating at say 4 MHz controls the transmitter and receiver (transceiver) in the cell phone. In sleep mode, a second fixed frequency oscillator operating at 32 KHz allows the transceiver to consume less power. The analog switch connects either the 4 MHz oscillator or the 32 KHz oscillator to the transceiver. It is not desirable at any point in time to have the 4 MHz oscillator and 32 KHz oscillator connected to the transceiver, or to each other, simultaneously. The BBM analog switch prevents such an occurrence. In a similar manner, analog switches can also switch between two different signal types, such as CDMA and TDMA.

In the prior art, the BBM electronic switch uses an RC circuit to impose a time delay between breaking one connection and making another connection. The time delay is set to worse case to insure that the old connection is indeed broken before the new connection is made. Unfortunately, worse case time delays limit the maximum operating switching speed of the analog switch. Moreover, RC delay circuits consume excessive area in integrated circuits.

Hence there is a need for a high-speed BBM switch circuit that increases operating speed, decreases die area, and minimizes costs.

DETAILED DESCRIPTION OF THE DRAWINGS

Figure 1:
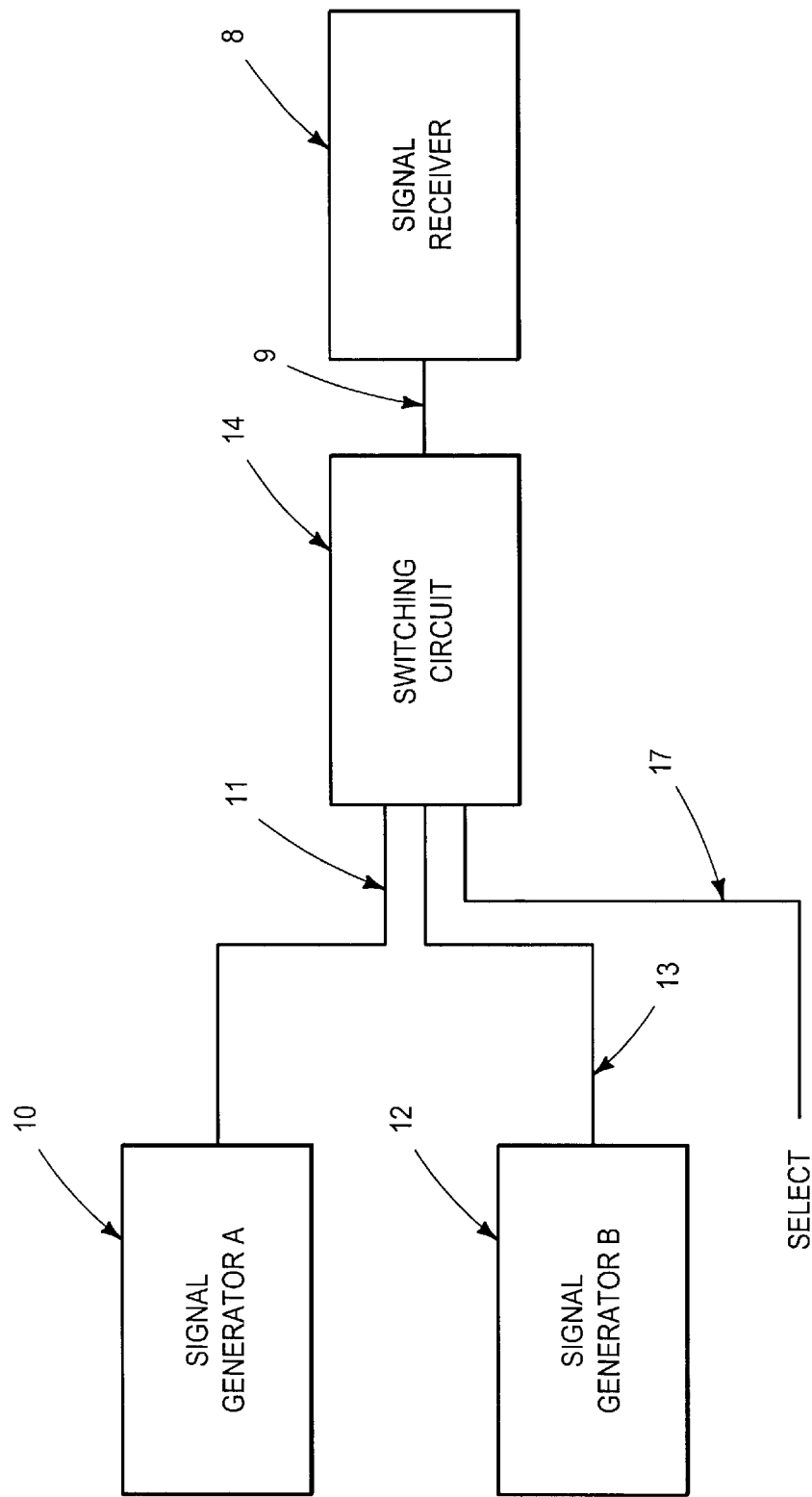
FIG. 1 is a block diagram illustrating a use for a high-speed break-before-make switching circuit.

In FIG. 1, is a block diagram illustrating an embodiment for the high-speed break-before-make switching circuit 14. The embodiment shows signal generators A, 10, and B, 12 having outputs coupled by way of conductors 11 and 13 to signal terminals of switching circuit 14. Another signal terminal of switching circuit 14 is coupled by way of conductor 9 to an input of signal receiver 8. Switching circuit 14 also has a selector input 17 that receives a digital SELECT signal. Switching circuit 14 ensures that a coupling to signal generator A, 10, is broken before a coupling to signal generator B, 12, is made.

Selector input 17 determines which signal switching circuit 14 throughputs to signal receiver 8. Switching circuit 14 is capable of receiving inputs 10 and 12 that are either digital or analog in nature. Although switching circuit 14 illustrates an embodiment that comprises signal inputs 11 and 13 and signal output 9, it should be noted that the switching circuit 14 is capable of bi-directional coupling. For example, switching circuit 14 can be coupled to have input 9 and outputs 11 and 13, or it can be coupled to have inputs 11 and 13 and output 9.

Figure 2:
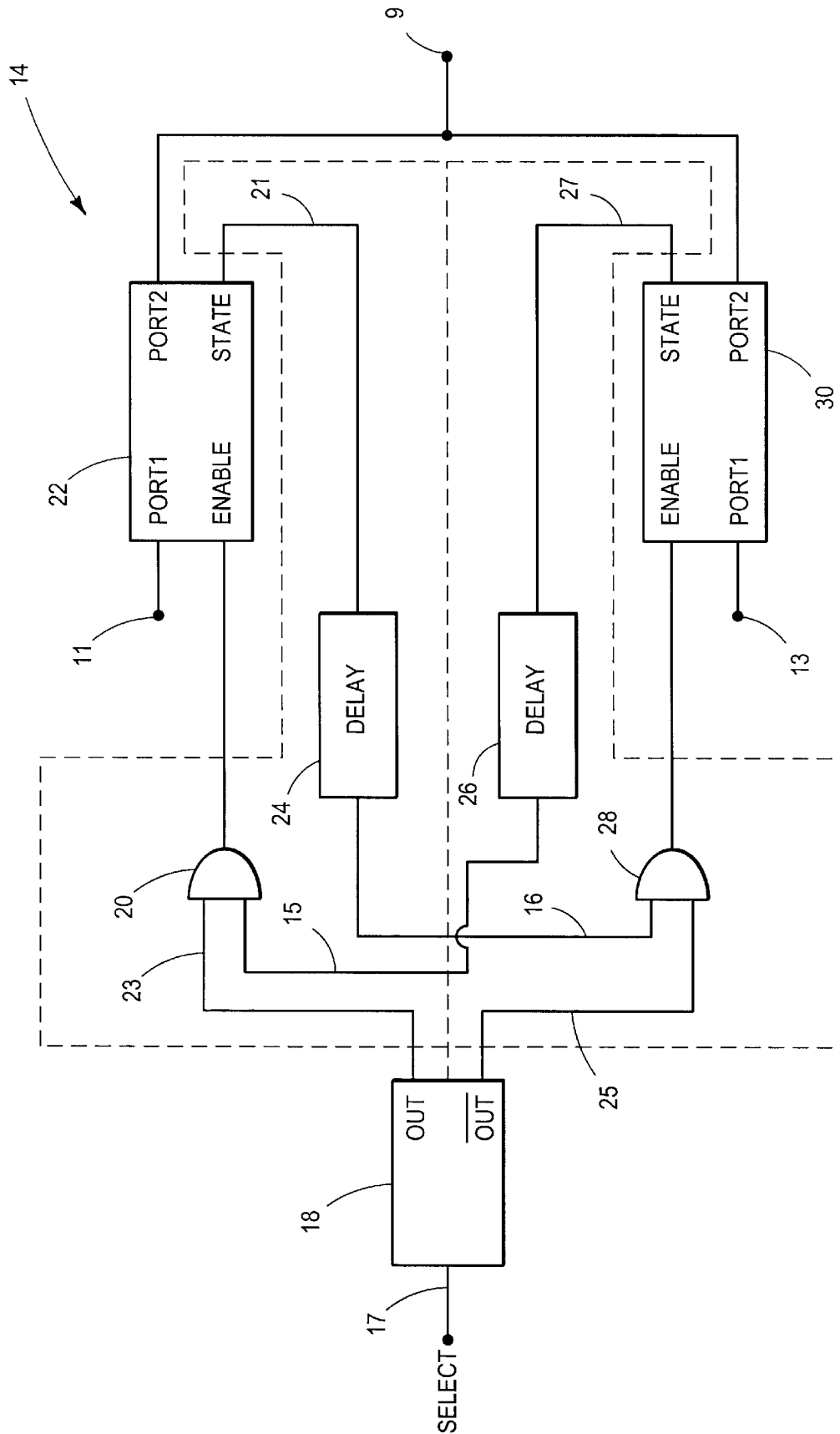
FIG. 2 is a schematic diagram illustrating high-speed break-before-make switching circuit 14 of FIG. 1.

Turning to FIG. 2, the figure represents a schematic and block diagram illustrating the high-speed break-before-make switching circuit 14 of FIG. 1. Switching circuit 14 is capable of bi-directional coupling. Switching circuit 14 as shown in FIG. 1 illustrates an embodiment with one input and two outputs. Other embodiments such as two inputs and one output can also be implemented.

Switching circuit 14 is coupled to receive signal A and signal B at terminals 11 and 13, respectively. Switching circuit 14 is coupled to receive a SELECT signal on input terminal 17. Switching circuit 14 connects signal A to conductor 9, and disconnects signal B from conductor 9, in response to a logic one SELECT signal. Switching circuit 14 connects signal B to conductor 9, and disconnects signal A from conductor 9, in response to a logic zero SELECT signal. And gates 20 and 28 form detection circuits that sense a first electrical element, such as switch 22, being in a disabled state before enabling a second electrical element, such as switch 30. Therefore, switching circuit 14 is a break-before-make type switch in that the prior connection is broken before the next connection is made.

Selection logic 18 operates in response to the SELECT signal to provide logic signals on conductors 23 and 25 based on following truth table 1.

| SELECT | A | B |
|---|---|---|
| 0 | Disconnect | Connect |
| 1 | Connect | Disconnect |

Assume the SELECT signal is logic one steady state. AND gate 28 receives a logic zero on its input 25. The output of AND gate 28 is logic zero, which is applied to the enable input of switch 30. Switch 30 is open and does not conduct signal B. The state output of switch 30 goes to logic one, which indicates that the switch is open. The logic one from the state output of switch 30 passes through delay circuit 26 and is applied to input 15 of AND gate 20. AND gate 20 also receives a logic one from selection logic 18 with the logic one SELECT signal. The output of AND gate 20 is logic one, which is applied to the enable input of switch 22. Switch 22 closes to conduct signal A to conductor 9. The state output of switch 22 goes to logic zero, which indicates that the switch is closed. The logic zero from the state output of switch 22 passes through delay circuit 24 and is applied to input 16 of AND gate 28 ensuring that its output remains logic zero and switch 30 remains open.

Now assume the SELECT signal changes state to logic zero to change the states of switches 22 and 30; however, at this time switch 30 is not closed. AND gate 28 receives a logic one on input 25, but its output remains logic zero because of the logic zero on input 16. The state output of switch 22 being logic zero, indicating switch 22 is still closed, prevents switch 30 from closing. Switch 30 remains open until such time as switch 22 breaks its connection. AND gate 20 receives a logic zero on input 23, which causes AND gate 20 output to go to logic zero. Switch 22 opens with the logic zero received at its enable input. Still switch 30 is not closed. After switch 22 breaks its connection to block signal A from conductor 9, the state output of switch 22 goes logic one. The logic one from the state output of switch 22 passes through delay circuit 24 after a predetermined time delay and is applied to input 16 of AND gate 28. The output of AND gate 28 goes to logic one and enables switch 30 to close thereby connecting signal B to conductor 9. The state output of switch 30 goes to logic zero to keep the output of AND gate 20 logic zero, and switch 22 open, while switch 30 is closed. Thus, the connection between signal A and conductor 9 is broken before the connection between signal B and conductor 9 is made.

Alternative embodiments are configured to operate a plurality of switches by simply altering the logic circuits coupled to receive the SELECT signals. Controlling multiple electrical elements simply becomes method of operating a logic circuit capable of processing multiple information bits. For example, logic circuits capable of handling two bits of information could be coupled to operate four electrical elements.

Figure 3:
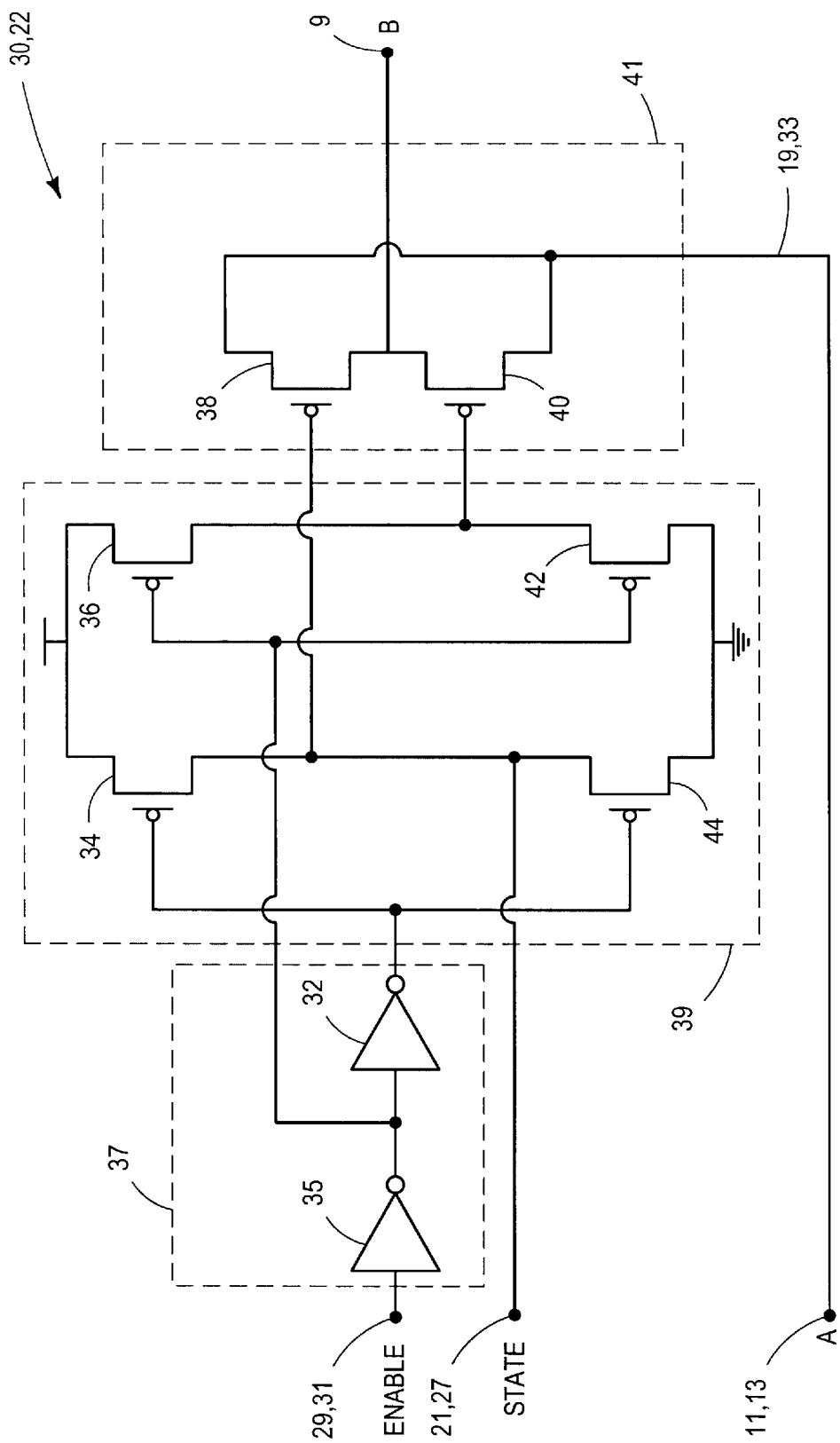
FIG. 3 is a schematic diagram illustrating a preferred embodiment of switches 22 and 30 of FIG. 2.

In FIG. 3, is a schematic diagram illustrating the circuitry of switches 22 and 30 from FIG. 2. Since both switches 22 and 30 are similar, switch 22 will be discussed. Furthermore, since signal terminals of switches 22 and 30 are similar, the signal terminals of switch 22 will be discussed.

Switch 22 is coupled to conduct a signal through a conduction path between signal terminal 11 and signal terminal 9 of switch 22. Switch 22 is also coupled to receive a SELECT signal at input 29. Once the decision to connect a signal is made based on the SELECT signal input, the conduction path is completed through signal terminals 11 and 9. Switch 22 is enabled to conduct a signal through signal terminal 11 when it receives a signal select of logic 1 at SELECT input 29. Furthermore, when a logic zero is received at SELECT input 29 switch 22 is disabled and the signal path is open. Switch 22 comprises three stages, inversion stage 37, selection stage 39, and connection stage 41. Inversion stage 37 comprises an input coupled to SELECT input 29 of switch 22 and first and second outputs of opposite polarity. Selection stage 39 comprises first and second inputs respectively coupled to the first and second outputs of the inversion stage 37. Connection stage 41 comprises first and second inputs respectively coupled to the first and second outputs of selection stage 39. Connection stage 41 also comprises signal terminals 11 and 9, which acts as a signal conduction path.

Inversion stage 37 comprises inverter 35 having an input coupled to SELECT input 29 of switch 22. The output of inverter 35 is coupled to the input of inverter 32. The output of inverter 32 is coupled to the first output of inversion stage 37. The output of inverter 35 is coupled to the second output of inversion stage 37, thus creating selection signals of opposite polarities.

Selection stage 39 comprises first and second inputs respectively coupled to the first and second outputs of inversion stage 37. The first input is further coupled to the control terminals of two transistors, p-type transistor 34 and n-type transistor 44. The second input is also coupled to the control terminals of two transistors, p-type transistor 36 and n-type transistor 42. P-type transistors 34 and 36 have first conduction terminals coupled to a first power supply conductor. N-type transistors 44 and 42 have first conduction terminals connected to second conduction terminals of p-type transistors 34 and 36 respectively. N-type transistors 44 and 42 have second conduction terminals connected to a second power supply conductor. The state output 21 of switch 22 is coupled to the second conduction terminal of p-type transistor 34 and the first conduction terminal of n-type transistor 44. The state output is determined by the conduction of either transistor 34 or 44. A first output of the selection stage 39 is coupled to the second conduction terminal of p-type transistor 34 and the first conduction terminal of n-type transistor 44. A second output of selection stage 39 also exists at the coupling between the second conduction terminal of p-type transistor 36 and the first conduction terminal of n-type transistor 42.

Connection stage 41 comprises first and second inputs respectively coupled to the first and second outputs of selection stage 39. The first input is coupled to the control terminal of p-type transistor 38 and the second input is coupled to the control terminal of n-type transistor 40. P-type transistor 38 has a first conduction terminal coupled to signal terminal 11 of switch 22 and a second conduction terminal coupled to signal terminal 9 of switch 22. N-type transistor 40 has a first conduction terminal coupled to the second conduction terminal of p-type transistor 38 and to signal terminal 9 of switch 22. N-type transistor 40 also has a second conduction terminal coupled to the first conduction terminal of p-type transistor 38 and to the signal terminal 11 of switch 22. When p-type transistor 38 and N-type transistor 40 of switch 22 are conducting, the signal path is completed through signal terminals 9 and 11.

Assume that switch 22 is currently receiving a SELECT signal of logic 1. A SELECT signal of logic 1 closes the switch in the signal path between signal terminals 11 and 9 and ensures that switch 22 stays closed. At the moment switch 22 receives a SELECT signal of logic zero, the SELECT signal is propagated through the inversion stage, where the first output propagates a logic one and the second output propagates a logic zero. The logic zero from the first output of inversion stage 37 stops conduction through n-type transistor 44 of selection stage 39 and starts conduction through p-type transistor 34 of selection stage 39. The conduction through p-type transistor 34 of selection stage 39 causes a logic one to be placed on the first output of state output 21 of switch 22. The logic one from the state output of selection stage 39 is used to complete a signal conduction path in another switch. Simultaneously, the logic one from the second output of inversion stage 37 stops conduction through p-type transistor 36 of selection stage 39 and starts conduction through n-type transistor 42 of selection stage 39. The conduction through n-type transistor 42 of selection stage 39 causes a logic zero to be placed on the second output of selection stage 39. The logic one from the first output of selection stage 39 stops conduction on p-type transistor 38 of connection stage 41. The logic zero from the second output of selection stage 39 stops conduction on n-type transistor 40 of connection stage 41. The cessation of conduction in p-type transistor 38 and n-type transistor 40 of connection stage 41 effectively breaks the signal conduction path between signal terminals 11 and 9, thus opening the switch.

Figure 4:
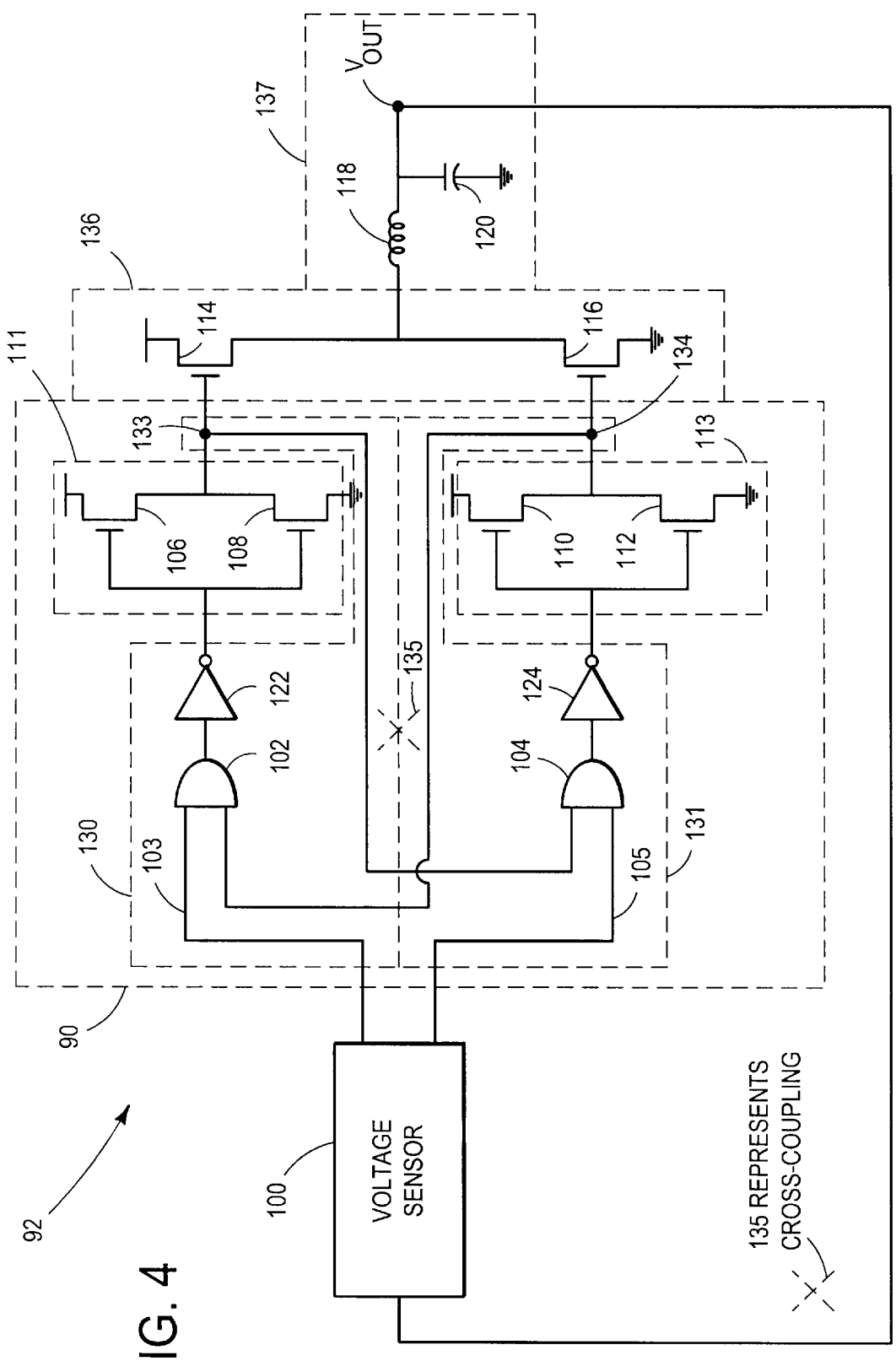
FIG. 4 is a schematic diagram showing a preferred embodiment of the high-speed break-before-make switching circuit within a switching power supply.

In FIG. 4, is a preferred embodiment for break-before-make switching circuit 90 within switching power supply 92. The embodiment high-speed break-before-make switching 90 having voltage sensor 100 with an input coupled for receiving a voltage regulated feedback signal and output terminals 103 and 105 coupled for transmitting drive SELECT signals of opposite polarity. The voltage regulated feedback signal determines the selection of the drive transistors 114 or 116 of drive stage 136 of switching power supply 92 based on predetermined voltage levels via the truth table from above, also shown below:

| SELECT | Drive Transistor 114 | Drive Transistor 116 |
|---|---|---|
| Over Voltage | Disconnect | Connect |
| Under Voltage | Connect | Disconnect |

Output terminals 103 and 105 of voltage sensor 100 are coupled to first inputs of detection circuits 130 and 131, respectively.

Detection circuits 130 and 131 are similar in design, therefore detection circuit 130 will be described. Detection circuit 130 has first and second inverting inputs respectively coupled to first and second inputs of AND gate 102, respectively. The output of AND gate 102 is coupled to an input of inverter 122. The output of inverter 122 is coupled to the output of detection circuit 130.

Outputs of detection circuits 130 and 131 are coupled to inputs of drive connection circuitry 111 and 113, at terminals 133 and 134, respectively. The outputs of drive connection circuits 111 and 113 are also fed back to the second inputs of detection circuits 131 and 130, respectively, for detecting when a switch is disabled.

Drive connection circuits 111 and 113 are similar in design, therefore drive connection circuit 111 will be described. Drive connection circuit 111 consists of an input coupled to control terminals of p-type transistor 106 and n-type transistor 108. P-type transistor 106 has a first conduction terminal coupled to a first power supply conductor and a second conduction terminal coupled to a first conduction terminal of n-type transistor 108 and to an output of drive connection circuit 111. N-type transistor 108 has a first conduction terminal coupled to the second conduction terminal of p-type transistor 106 and a second conduction terminal coupled to a second power supply conductor.

The remainder of switching power supply 92 comprises drive stage 136 and output stage 137. Outputs of drive connection circuits 111 and 113 are connected to first and second inputs of drive stage 136, respectively. Drive stage 136 comprises n-type transistors 114 and 116 having control terminals coupled to the first and second inputs of drive stage 136, respectively. N-type transistor 114 has a first conduction terminal coupled to a first power supply conductor and a second conduction terminal coupled to the output of drive stage 136. N-type transistor 116 has a first conduction terminal coupled to the second conduction terminal of drive transistor 114 and a second conduction terminal coupled to a second power supply conductor.

The output of drive stage 136 is coupled to an input of output stage 137. Output stage 137 comprises inductor 118 having a first terminal coupled to the input of output stage 137. A second terminal of inductor 118 is coupled to a first output of output stage 137 to provide a voltage regulated feedback signal to voltage sensor 100 of switching circuit 90, which in turn provides drive transistor selection based on a predetermined level of the voltage regulated feedback signal. The second terminal of inductor 118 is also coupled to a second output of output stage providing a regulated voltage output for switching power supply 92 and to a first terminal of filter capacitor 120. A second terminal of the filter capacitor 120 is coupled to a first power supply conductor.

The preferred embodiment of switching power supply circuit 92 regulates the voltage output based on a load placed upon switching power supply 92. The detection of drive stage 136 to switch drive inputs is based on a voltage regulated feedback signal from output stage 137 to the input of high-speed break-before-make switching circuit 90. Assume n-type transistor 114 of drive stage 136 is selected and n-type transistor 116 of drive stage 136 is not based on the load placed upon switching power supply 100. Once the load changes by a predetermined amount, a voltage regulated feed back signal to voltage sensor 92 causes a logic one to throughput to detection circuit 130, thereby causing AND gate 102 of detection circuit 130 to output a logic zero. At this time, drive connection circuit 113 remains disconnected and AND gate 104 of detection circuit 131 still outputs a logic one. The logic one output of AND gate 102 of detection circuit 130 is inverted to a logic zero after passing through inverter 122 of detection circuit 130. The arrival of the logic zero at drive connection circuit 111 causes p-type transistor 106 to turn off and n-type transistor 108 to turn on, which effectively disconnects n-type transistor 114 of drive stage 136 while drive connection circuit 116 remains disconnected. Simultaneously, the logic zero is fed back to the second input of detection circuit 131. Since the first input of AND gate 104 of detection circuit 131 is a logic zero from voltage sensor 100, AND gate 104 of detection circuit 131 produces a logic one. Both n-type transistor 116 and n-type transistor 114 of drive stage 136 are disconnected from drive connection circuit 113. The logic one passes through inverter 124 of detection circuit 131 to become a logic zero. The logic zero is coupled to the input of drive connection circuit 113 which turns on p-type transistor 110, turns off n-type transistor 112, and effectively connects n-type transistor 116 of drive stage 136, while n-type transistor 114 remains disconnected. The output of drive stage 136 now provides a switched voltage regulated signal to the input of output stage 137. Output stage 137 then provides a voltage regulated feedback signal to the output switching power supply 92 responsive to a variable load. The output stage further provides the voltage regulated feedback signal to voltage sensor 100. The symmetry of high-speed break-before-make switching circuit 90 explains a selection change from drive transistor 116 of drive stage 136 to drive transistor 114 of drive stage 136.

Figure 5:
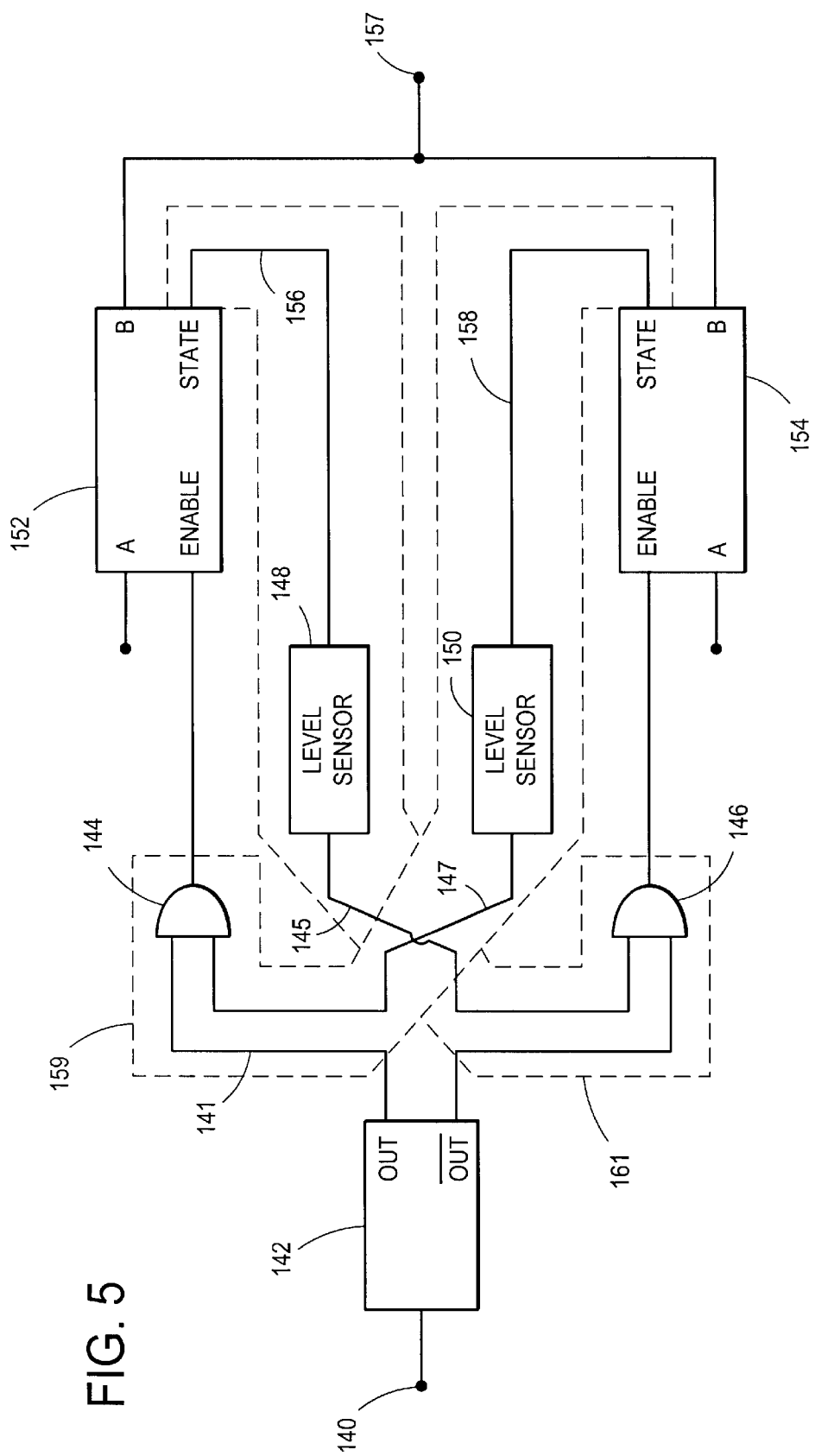
FIG. 5 is a schematic diagram showing a preferred embodiment of the high-speed break-before-make switching circuit employing a level sensor.

In FIG. 5, the figure represents a schematic and block diagram illustrating high-speed break-before-make switching circuit 160. Switching circuit 160 is coupled to operate electrical elements 152 and 154. Switching circuit 160 is coupled to receive a SELECT signal on input terminal 140. Switching circuit 160 enables operation of electrical element 152 on terminal 157, and disables electrical element 154 from terminal 157, in response to a logic one SELECT signal. Switching circuit 160 enables operation of electrical element 154 on terminal 157, and disables electrical element 152 on terminal 157, in response to a logic zero SELECT signal.

AND gate 144 forms first detection circuit 159 that senses electrical element 154 being in a disabled state before enabling electrical element 152. AND gate 146 forms second detection circuit 161 that senses electrical element 152 being in a disabled state before enabling electrical element 154.

Selection logic 142 operates in response to the SELECT signal to provide logic signals on conductors 141 and 143 based on following truth table 1.

| SELECT | element 152 | element 154 |
|--------|-------------|-------------|
| 0 | Disconnect | Connect |
| 1 | Connect | Disconnect |

Assume the SELECT signal is logic one steady state. AND gate 144 receives a logic zero on its input 141. The output of AND gate 146 is logic zero, which is applied to the enable input of electrical element 154. The state output of electrical element 154 goes to logic one, which indicates that electrical element 154 is disabled. The logic one from the state output of electrical element 154 passes through an optional level sensor 155 and is applied to input 147 of AND gate 144. AND gate 144 also receives a logic one from selection logic 142 with the logic one SELECT signal. The output of AND gate 144 is logic one, which is applied to the enable input of electrical element 152. Electrical element 152 is disabled and the state output of electrical element 152 goes to logic zero, which is detected by detection circuit 161. The logic zero from the state output of electrical element 152 passes through level sensor 148 and is applied to input 145 of AND gate 146, thus ensuring that electrical element 152 is disabled before electrical element 154 is enabled. Switching to disable electrical element 154 and re-enable electrical element 152 is performed in a similar manner, already described in the description of FIG. 2.

Optional level sensors 148 and 150 of detection circuits 161 and 159, respectively, further ensure that switching from the operation of electrical element 152 to electrical element 154 does not take place before electrical element 152 is disabled. The level sensor could be implemented in a myriad of ways. For example, a comparator could be employed to compare the detected input of the detection circuit against a predetermined voltage reference signal. The sensor may be used when speed and complexity make it necessary to avoid a "race" condition from occurring during the enabling and disabling operations of electrical elements 152 and 154.

What is claimed is:

1. A switching circuit, comprising:
   a first logic gate having a first input coupled for receiving a first select signal and a second input coupled for detecting a first disabling signal;
   a second logic gate having a first input coupled for receiving a second select signal and a second input coupled for detecting a second disabling signal;
   a first switch having first and second signal terminals, an enabling input coupled to an output of the first logic gate for enabling a first input signal to conduct between the first and second signal terminals, and a state output coupled to a second input of the second logic gate; and
   a second switch having first and second signal terminals, an enabling input coupled to an output of the second logic gate for enabling a second input signal to conduct between the first and second signal terminals, and a state output coupled to a second input of the first logic gate.

2. The switching circuit of claim 1, wherein the first logic gate comprises an AND gate.

3. The switching circuit of claim 1, wherein the second logic gate comprises an AND gate.

4. The switching circuit of claim 1, wherein the switching circuit further includes:
   a first buffer having an input coupled to the state output of the first switch, and an output coupled to the second input of the second logic gate; and
   a second buffer having an input coupled to the state output of the second switch, and an output coupled to the second input of the first logic gate.

5. The switching circuit of claim 4, wherein the first buffer further includes a delay circuit.

6. The switching circuit of claim 1, wherein the first switch further includes:
   an inversion stage having an input coupled to the enabling input of the first switch;
   a selection stage having first and second inputs respectively coupled to first and second outputs of the inversion stage and a state output coupled to the second input of the second logic gate; and
   a connection stage having first and second inputs respectively coupled to first and second outputs of the selection stage, and first and second conduction terminals respectively coupled to the first and second signal terminals to form a conduction path when enabled.

7. The switching circuit of claim 6, wherein the inversion stage of the first switch further includes a first buffer having an input coupled to the input of the inversion stage and an output coupled to the first and second outputs of the inversion stage.

8. The switching circuit of claim 7, wherein the first buffer of the inversion stage further includes an inverter having an input coupled to the input of the first buffer of the inversion stage and an output coupled to the output of the first buffer of the inversion stage.

9. The switching circuit of claim 7, wherein the inversion stage of the first switch further includes a second buffer having an input coupled to the output of the first buffer of the inversion stage and an output coupled to the first output of the inversion stage.

10. The switching circuit of claim 9, wherein the second buffer of the inversion stage further includes an inverter having an input coupled to the input of the second buffer of the inversion stage and an output coupled to the output of the second buffer of the inversion stage.

11. The switching circuit of claim 6, wherein the selection stage of the first switch further comprises:
   a first transistor having a control terminal coupled to the first output of the inversion stage, a first conduction terminal coupled to a first power supply conductor, and a second conduction terminal coupled to the state output of the first switch and to the first output of the selection stage;
   a second transistor having a control terminal coupled to the first output of the inversion stage, a first conduction terminal coupled to the second conduction terminal of the first transistor and to the state output of the first switch and to the first output of the selection stage, and a second conduction terminal coupled to a second power supply conductor;
   a third transistor having a control terminal coupled to the second output of the inversion stage, a first conduction terminal coupled to the first power supply conductor, and a second conduction terminal coupled to the second output of the selection stage; and
   a fourth transistor having a control terminal coupled to the second output of the inversion stage, a first conduction terminal coupled to the second conduction terminal of the third transistor and to the second output of the selection stage, and a second conduction terminal coupled to the second power supply conductor.

12. The switching circuit of claim 6, wherein the connection stage of the first switch further comprises:
   a first transistor having a control terminal coupled to the first output of the selection stage, a first conduction terminal coupled to the first conduction terminal of the connection stage, and a second conduction terminal coupled to the second conduction terminal of the connection stage; and
   a second transistor having a control terminal coupled to the first output of the selection stage, a first conduction terminal coupled to the second conduction terminal of the first transistor and to the first conduction terminal of the connection stage, and a second conduction terminal coupled to the first conduction terminal of the connection stage.

13. A circuit, comprising:
   a first electrical element coupled for operation having a state output;
   a second electrical element coupled for operation having a state output;
   a first detection circuit having an input coupled to the second electrical element for detecting the second electrical element being in a disabled state, and an output coupled to an enabling input of the first electrical element; and
   a second detection circuit having an input coupled to the first electrical element for detecting the first element being in a disabled state, and an output coupled to an enabling input of the second electrical element.

14. The circuit of claim 13, wherein the first detection circuit comprises a logic gate having a first input coupled for receiving a select signal and a second input coupled for detecting the second electrical element being disabled.

15. The circuit of claim 14, wherein the logic gate comprises an AND gate.

16. The circuit of claim 13, wherein the first detection circuit further includes a buffer having an input coupled for detecting the second electrical element being in a disabled state, and an output coupled to the second input of the second logic gate.

17. The circuit of claim 16, wherein the buffer further includes a comparator coupled for detecting the second electrical element being in a disabled state, having an input coupled to a power supply conductor, and an output coupled for providing a compared signal for detecting the second electrical element being in a disabled state.

18. A switching circuit, comprising:
   first and second switches each having an enable input for controlling conduction between first and second terminals of the first and second switches respectively;
   a first detection circuit having a first input coupled to a state output of the second switch for monitoring an operational state of the second switch, a second input responsive to a select signal and an output coupled to the enable input of the first switch; and
   a second detection circuit having a first input coupled to a state output of the first switch for monitoring an operational state of the first switch, a second input responsive to the select signal and an output coupled to the enable input of the second switch whereby the first switch is disabled before the second switch is enabled.

19. The switching circuit of claim 18, wherein the first switch further includes:
   a first transistor having a control terminal coupled to the input of the first switch, a first conduction terminal coupled to a first power supply conductor, and a second conduction terminal coupled to the output of the connection circuit; and
   a second transistor having a control terminal coupled to the input of the first switch, a first conduction terminal coupled to the first conduction terminal of the first transistor and to the output of the connection circuit, and a second conduction terminal coupled to a second power supply conductor.

20. The switching circuit of claim 19, wherein the first transistor further comprises a p-type transistor.

21. The switching circuit of claim 19, wherein the second transistor further comprises an n-type transistor.

22. The switching circuit of claim 18, wherein the detection circuit further comprises a logic gate having an input coupled for monitoring the enable input of the second switch and an output coupled to the enable input of the first switch.

23. The switching circuit of claim 22, wherein the first logic gate further comprises an AND gate.

24. The switching circuit of claim 18, wherein the detection circuit further comprises a buffer having an input coupled for monitoring the enable input of the second switch and an output coupled for providing a monitored signal of the first electrical element.

25. The circuit of claim 24, wherein the buffer further includes a comparator coupled for monitoring the second electrical element being in a disabled state, having an input coupled to power supply conductor, and an output coupled for providing a compared signal for monitoring the second electrical element being disabled.

26. A method of operating first and second electrical elements, comprising:
   selecting the first or second electrical element based on a binary input;
   disabling the first electrical element based on a predetermined value of the binary input;
   detecting the first electrical element being in a disabled state; and
   enabling operation of the second electrical element after detecting the first electrical element being in the disabled state.

27. A method of operating first and second electrical elements, comprising;
   disabling the first electrical element;
   detecting a state output of the first electrical element to determine whether the first electrical element is in a disabled state;
   comparing the state output of the first electrical element to a select signal; and
   providing an enabling signal upon detecting the first electrical element being disabled to enable operation of the second electrical element with the select signal after detecting the first electrical element being in a disabled state.

* * * * *